(12) United States Patent
De Micheli et al.

(10) Patent No.: US 9,252,252 B2
(45) Date of Patent: Feb. 2, 2016

(54) AMBIPOLAR SILICON NANOWIRE FIELD EFFECT TRANSISTOR

(71) Applicants: Giovanni De Micheli, Lausanne (CH); Yusuf Leblebici, Lutry (CH); Michele De Marchi, Lausanne (CH); Davide Sacchetto, Lausanne (CH)

(72) Inventors: Giovanni De Micheli, Lausanne (CH); Yusuf Leblebici, Lutry (CH); Michele De Marchi, Lausanne (CH); Davide Sacchetto, Lausanne (CH)

(73) Assignee: ECOLE POLYTECHNIQUE FÉDÉRALE DE LAUSANNE (EPFL), Lausanne (CH)

(*) Notice: Subject to any disclaimer, the term of this patent is extended or adjusted under 35 U.S.C. 154(b) by 82 days.

(21) Appl. No.: 13/899,666

(22) Filed: May 22, 2013

(65) Prior Publication Data

US 2013/0313524 A1  Nov. 28, 2013

Related U.S. Application Data

(60) Provisional application No. 61/650,503, filed on May 23, 2012.

(51) Int. Cl.
 *H01L 21/00* (2006.01)
 *H01L 21/32* (2006.01)
 (Continued)

(52) U.S. Cl.
 CPC .............. *H01L 29/775* (2013.01); *B82Y 10/00* (2013.01); *H01L 29/0673* (2013.01); *H01L 29/42356* (2013.01); *H01L 29/42392* (2013.01); *H01L 29/66439* (2013.01); *H01L 29/7839* (2013.01); *H01L 29/78642* (2013.01); *H01L 29/78696* (2013.01)

(58) Field of Classification Search
 CPC ............ H01L 29/775; H01L 29/66439; H01L 29/408; H01L 29/606; H01L 29/0673; H01L 21/33

USPC ......... 257/29, 40, 330–350, 43, 295, 314, 14, 257/E29.082, E29.084, E29.089, E29.255, 257/E21.09, E29.068, E21.409, 257/E21.618–E21.636; 438/149–258, 478, 438/287; 977/937, 720–723, 701, 888, 755, 977/938, 940

See application file for complete search history.

(56) References Cited

U.S. PATENT DOCUMENTS

| | | | |
|---|---|---|---|
| 2005/0079659 A1* | 4/2005 | Duan ..................... | B82Y 10/00 438/197 |
| 2009/0174435 A1* | 7/2009 | Stan ....................... | B82Y 10/00 326/112 |

(Continued)

*Primary Examiner* — Amar Movva
*Assistant Examiner* — Sheikh Maruf
(74) *Attorney, Agent, or Firm* — The Law Office of Joseph L. Felber

(57) ABSTRACT

This invention describes a novel electronic device consisting of one—or more—vertically stacked gate-all-around silicon nanowire field effect transistor (SNWFET) with two independent gate electrodes. One of the two gate electrodes, acting on the central section of the transistor channel, controls on/off behavior of the channel. The second gate, acting on the regions in proximity to the source and the drain of the transistor, defines the polarity of the devices, i.e. p or n type. The electric field of the second gate acts either at the interface of the nanowire-to-source/drain region or anywhere in close proximity to the depleted region of the SiNW body, modulating the bending of the Schottky barriers at the contacts, eventually screening one type of charge carrier to pass through the channel of the transistor. This is achieved by controlling the majority carriers passing through the transistor channel by regulating the Schottky barrier thicknesses at the source and drain contacts.

12 Claims, 13 Drawing Sheets

(51) Int. Cl.
*H01L 21/47* (2006.01)
*H01L 29/775* (2006.01)
*H01L 29/66* (2006.01)
*H01L 29/423* (2006.01)
*H01L 29/78* (2006.01)
*H01L 29/06* (2006.01)
*H01L 29/786* (2006.01)
*B82Y 10/00* (2011.01)

(56) References Cited

U.S. PATENT DOCUMENTS

| | | | |
|---|---|---|---|
| 2010/0237336 A1* | 9/2010 | Rinzler | B82Y 10/00 257/40 |
| 2010/0330687 A1* | 12/2010 | Afzali-Ardakani | B82Y 10/00 436/149 |
| 2011/0127493 A1* | 6/2011 | Cabral, Jr. | B82Y 10/00 257/24 |
| 2012/0028820 A1* | 2/2012 | Rhodes | B82Y 15/00 506/9 |
| 2012/0088367 A1* | 4/2012 | Sekar | H01L 21/8221 438/694 |
| 2012/0181508 A1* | 7/2012 | Chang | H01L 21/8221 257/29 |
| 2013/0119348 A1* | 5/2013 | Zhou | H01L 29/775 257/29 |
| 2013/0140606 A1* | 6/2013 | Koo | H01L 29/66984 257/195 |
| 2014/0077161 A1* | 3/2014 | Duan | B82Y 10/00 257/29 |
| 2014/0158987 A1* | 6/2014 | Song | H01Q 1/1271 257/29 |

* cited by examiner

NiSi contacts

AMBIPOLAR SILICON NANOWIRE FIELD EFFECT TRANSISTOR

FIELD OF INVENTION

The present invention relates to silicon nanowire field effects transistors (SNWFETs) and more precisely to new SNWFET architectures and processes for manufacturing such architectures.

BACKGROUND

Bulk CMOS technologies are predicted to face crucial technological challenges in the next decade. At the same time, novel devices such as Carbon Nanotube Field Effect Transistors (CNTFETs) and Silicon Nanowire Field Effect Transistors (SNWFETs), which do not suffer from the same constraints, are expected to play a primary role as devices in future ultra-large scale integration technologies.

The interest in these devices is motivated not only by their small size, but also their superior characteristics, such as quasi-ballistic transport, steep sub-threshold slopes and one-dimensional channel geometry. Channel geometry, specifically, plays a major role in the current efforts towards miniaturization of devices, with transistor manufacturers currently moving from planar bulk MOSFETs to fully depleted SOI and FinFETs. Fully depleted SOIs, in particular, exploit the presence of a buried oxide layer below the device channel to screen the drain electric field from interfering with the gate electric field, thus reducing short channel effects. Moreover, fully depleting the channel enhances the device switching speed by requiring less gate field to turn on the device. FinFETs are a further evolution of this concept, exploiting vertical fin-like device channels, which can fully deplete and can be controlled on three surfaces by the electric field. In order to obtain the best electrostatic control over the device channel, however, one-dimensional channel structures need to be implemented. These include semiconducting mono or polycrystalline nanowires and carbon nanotubes (CNTs).

Among the types of CNTFETs demonstrated in literature, double-gate ambipolar CNTFETs are four-terminal devices where a second gate terminal is added to control the device polarity [3]. These devices combine performance exceeding that of current scaled MOSFETs, with the possibility to control the device polarity by electrostatic doping of the nanotubes [1]. Nevertheless, CNTFETs, as well as catalyst-grown nanowires, require a bottom-up fabrication approach, where nanotubes/nanowires are first grown in dedicated furnaces and subsequently purified, selected and transferred on the final substrate. Bottom up approaches have not been successful in proposing a large-scale device integration method primarily due to the challenges in selecting and positioning channel elements on the final substrates.

GENERAL DESCRIPTION OF THE INVENTION

The present invention encompasses, among other objects, an electronic device consisting of one—or more—vertically stacked gate-all-around silicon nanowire field effect transistor (SNWFET) with two independent gate electrodes. One of the two gate electrodes, acting on the central section of the transistor channel, controls on/off behavior of the channel. The second gate, acting on the regions in proximity to the source and the drain of the transistor, defines the polarity of the devices, i.e., p or n type. The electric field of the second gate acts either at the interface of the nanowire-to-source/drain region or anywhere in close proximity to the depleted region of the SiNW body, modulating the bending of the Schottky barriers at the contacts, eventually screening one type of charge carrier to pass through the channel of the transistor. This is achieved by controlling the majority carriers passing through the transistor channel by regulating the Schottky barrier thicknesses at the source and drain contacts.

The present invention also discloses a method of fabricating semiconducting channel field-effect transistors having controlled polarity (n or p-type) by means of a double gate structure including a control gate and an independent polarity gate electrode. In one embodiment, the method includes forming a device channel composed of a stack of horizontal semiconducting nanowires held between two pillar-like source and drain contacts in which the pillars may also be hollowed down to a given depth by dry or wet etching and the silicide formed so as to reach the bottom nanowire and reduce contact resistance. A gate-all-around structure is then formed covering the side regions of the channel, in proximity of the source and drain Schottky barriers, the gate constructions allowing to form a positive or a negative electric field potential distribution between the gate structure and either the interface between the SiNW channel and/or the region of the SiNW which is depleted by the presence of the Schottky barrier contact. In another embodiment, the gate structure utilized to influence the region at the Schottky barrier interface or the neighboring region influenced by the presence of the Schottky contact is effective only to a reduced portion of the mentioned regions. In yet another embodiment the gate affects only the region in proximity of the source, either totally or partially. Finally, a second gate structure is formed around the central region of the nanowire stack along the nanowire length. In another embodiment, one or more parallel vertical semiconducting nanowires form the device channel, and the gate structures surround the vertical nanowires and are grown horizontally. In another embodiment, a vertical semiconducting fin-like structure forms the device channel, and the gate structures surround the fin-like channel covering the three exposed surfaces: the two fin side surfaces and the top surface. In another embodiment, a graphene ribbon forms the device channel, and the gate structure covers the top surface of the ribbon, or both the bottom and top surfaces of the ribbon.

This structure differs from conventional independent double gate devices, such as the one described in [2], where the second gate acts on the same region of the transistor channel as the first gate. In the case of the conventional independent double gate devices, the second gate is mainly used to tune the threshold voltage of the device. This tuning can be advantageous to reduce power consumption or tune device speed at runtime. Threshold tuning can also be present in our invention by the fact that the electric field distribution generated by one gate also affects the electric field distribution of the other gate. In this case the achievement of a polarity control by a double independent gate structure can also imply a threshold tuning, whose effects can be amplified or reduced by engineering electric field distributions generated by the two gates. This has to do with both the geometry of the gate construction and the materials utilized for electric field isolation. Nonetheless, another embodiment of the invention is the threshold tuning of polarity-controlled devices, which is a direct consequence of mutual dependence of the electric field potentials generated by the two gates. However, the structures described in [2] have the only purpose of achieving threshold tuning but at the same time present technological disadvantages such as the precise alignment of the two gates at the sides of the channel, and their independent doping.

Regarding the different solutions, the ambipolar-controlled logic gates is amongst the most promising ones, thanks to the higher expressive logic power due to the polarity control as state variable [4]. The polarity control can be achieved in ambipolar devices by using a double independent gate (DIG) structure. A few examples can be found for DIG FETs based on carbon nanotubes [5], [6], graphene [7], semiconducting polymers and silicon nanowires (SiNWs) [8]. Nevertheless, very limited research has been done in terms of integrating of ambipolar-controlled devices with CMOS compatible top-down Si fabrication flow, which is crucial for large-scale systems integration. The inventors demonstrated a double independent gate configuration with SiNW and top-down fabrication flow as useful building block for ambipolar-controlled logic operation [9]. Moreover, using the structure proposed in the present invention, more efficient logic circuits are fabricated, as demonstrated by the authors in [10,11,13].

In another embodiment the invention is based on a top-down fabrication procedure, with the nanowires being formed by a single etching step [12]. This method enables fabrication of horizontal nanowires, which can be stacked one on top of each other to increase device sizing. Moreover, several parallel nanowires can be fabricated with this method, further expanding the functioning range of our devices in terms of maximum ON current and power.

The unique combination of the invention herein described and specifically with respect to the following points:

1. Top-Down fabrication flow
2. CMOS compatible fabrication flow enables the use of the device physical properties for regular fabric tiles made of polarity-controlled gates in large arrays. Thus the use of polarity-controlled devices and, more in general, of the ambipolarity property as a state variable, is enabled for computation in large electronic circuits by our invention. In fact, repeatable and reliable arrays of polarity-controlled devices fabricated by either bottom-down fabrication processes or non-repeatable device structures cannot be utilized in applications where large arrays of ambipolar devices with two double independent gates and polarity control are needed, due to the strict requirements of signal consistency and signal integrity.

In a first aspect the invention provides a silicon nanowire (SiNW) field effect transistor device with a double independent gate structure comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel.

In a second aspect the invention provides a method for manufacturing a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel. The method comprises steps of forming the SiNW channel from horizontal semiconducting nanowires; forming a vertical stack composed of a number of horizontal nanowires ranging from 1 to about 1000, held between two pillar-like structures; forming an insulating layer on which a gate electrode is formed, covering the regions of the vertical stack composed of horizontal nanowires, in proximity of the source and drain contacts of the device; forming a second insulating layer on which a second gate electrode is formed, covering a center region of the vertical stack composed of horizontal nanowires; forming a metallic layer on the source and drain pillars and creating a silicide in proximity of side regions of the vertical stack composed of horizontal nanowires, and forming a metallic region close to the source and drain in which the pillars may also be hollowed down to a given depth by dry or wet etching and the silicide formed so as to reach the bottom nanowire and reduce contact resistance.

In a first preferred embodiment vertical stack composed of horizontal nanowires is isolated from the transistor substrate by a dielectric, such as a buried oxide (BOX) layer.

In a second preferred embodiment the vertical stack composed of horizontal nanowires is electrically connected to the substrate.

In a third aspect the invention provides a method for manufacturing a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel. The method comprises forming a vertical semiconducting structure, self sustaining or sustained by pillar like structures; Forming an insulating layer on which a gate electrode is formed, covering the side and top surfaces of the fin-like structure in proximity of the source and drain contacts of the device; forming a second insulating layer on which a second gate electrode is formed, covering the center region of the fin-like structure at the side and top surfaces; forming a metallic layer on the source and drain pillars or regions and creating a silicide in proximity of the side regions of the fin-like structure; and forming a metallic region close to the source and drain in which the pillars may also be hollowed down to a given depth by dry or wet etching and the silicide formed so as to reach the bottom of the fin and reduce contact resistance.

In a third preferred embodiment the fin-like structures are isolated from the transistor substrate by a dielectric, such as a buried oxide (BOX) layer.

In a fourth preferred embodiment the fin-like structures are electrically connected to the substrate.

In a fourth aspect the invention provides a method for manufacturing a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, comprising an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel. The method comprises forming a horizontal or vertical graphene nanoribbon connected between two metallic source and drain contacts; forming an insulating layer on which a gate electrode is formed, covering one or both surfaces of the graphene ribbon in proximity of the source and drain contacts of the device; and forming a second insulating layer on which a second gate electrode is formed, covering the center region of the ribbon at one or both surfaces.

In a fifth preferred embodiment the channel is formed from at least one of: Si, SiGe, Ge, using a top-down fabrication method such as using a controlled Bosch process dry etching or an anisotropic vertical etch plus a selective Si/SiGe etch.

In a fifth aspect the invention provides a method for manufacturing a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel. The two gate dielectric layers are each formed from at least one of: $SiO_2$, $HfO_2$, $Al_2O_3$, $TiO_2$, TiON, TiSiON, HfSiO, HfSiON, AlSiO, AlSiON.

In a sixth preferred embodiment the method is with any stoichiometry of the described dielectric layers.

In a sixth aspect the invention provides a method for manufacturing a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel. The metallic layer of choice is comprised from at least one transition metal (e.g. Ni, Ti, Co, Mn, Pt, Pd, . . . ).

In a seventh aspect the invention provides a method for manufacturing a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel. The silicide is formed from at least one transition metal (e.g. NiSi, NiSi2, TiSi2, CoSi, PdSi2, PtSi, . . . ).

In an eighth aspect the invention provides top down fabrication of sea-of-gates topology with ambipolar devices relying on double independent gate architecture for customization of their functionality.

In a ninth aspect the invention provides use of a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel, as a basic tile for fabrication of a sea-of-gates topology.

In a tenth aspect the invention provides use of a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel. The electric field potential to modulate the regions of the SiNW channel affected by the presence of the Schottky barrier interface is partially affected by the electric field potential, which modulates the further regions of the semiconducting channel not affected by the presence of the Schottky barrier interface.

In an eleventh aspect the invention provides use of a silicon nanowire (SiNW) field effect transistor device with a double independent gate structure, the silicon nanowire field effect transistor comprising a first gate used to build up an electric field potential to modulate regions of a SiNW channel affected by a presence of a Schottky barrier interface, that comprises an interface region between the metal-to-semiconductor contact; and a depleted region in the semiconductor whose depletion is consequence of the presence of the Schottky contact. The silicon nanowire field effect transistor further comprises a second gate structure utilized to produce an electric field potential, which modulates further regions of the semiconducting channel not affected by the presence of a Schottky barrier interface, namely a portion of the channel. The electric field potential, which modulates the further regions of the semiconducting channel not affected by the presence of the Schottky barrier interface is partially affected by the electric field potential to modulate the regions of the SiNW channel affected by the presence of the Schottky barrier interface.

BRIEF DESCRIPTION OF THE DRAWINGS

The invention will be understood better in light of the detailed description and of the figures, wherein the following short introduction is given:

FIG. 3A: Top view of the dual gate device. The next steps focuses on the double independent gate area construction;

FIG. 3B: Photoresist mask is patterned;

FIG. 3C: After isotropic etching of Si a triangular-shaped SiNW is formed;

FIG. 3D: Gate oxidation and LPCVD polysilicon are deposited and patterned to form the main, central gate stack;

FIG. 3E: A low temperature oxide (LTO) inter-poly dielectric is deposited and a second polysilicon gate is made self-aligned with the nanowire;

FIG. 3F: Focused ion beam cross-section showing a triangular SiNW channel with two 75 nm sides and 100 nm base. The gate1, gate2 and the LTO inter-poly dielectric have 150 nm, 500 nm and 300 nm thicknesses, respectively. Gate1 dielectric is 30 nm thick;

FIG. 4A: 3D View of a double independent gate structure with vertical Si nanowire channel;

FIG. 4B: Side View of a SiO2/Si3N4 hard mask patterned on top of the SOI device layer;

FIG. 4C: Side View of a vertical Si nanowire etched in the SOI device layer. A residual Si layer is left;

FIG. 4D: Side View of a vertical Si nanowire surrounded by a SiO2 or Si3N4 spacer;

FIG. 4E: Side View of a vertical Si nanowire surrounded by a SiO2 or a Si3N4 spacer after the patterning of the residual Si layer;

FIG. 4F: Side View of the vertical Si nanowire structure after NiSi formation and excess Ni etch by a hot Piranha solution;

FIG. 4G: Side View of the vertical Si nanowire structure after high-k dielectric replacement and TiN electrode patterning;

FIG. 4H: Side View of the vertical Si nanowire structure after the first gate is patterned;

FIG. 4I: Side View of the vertical Si nanowire structure after the first gate is patterned on the high-k/TiN samples;

FIG. 4J: Side View of the vertical Si nanowire structure after the second gate is patterned;

FIG. 4K: Side View of the vertical Si nanowire structure after the second gate is patterned on the high-k/TiN samples;

FIG. 4L: Side View of the vertical Si nanowire structure after the first gate is extended in the region close to the top NiSi contact;

FIG. 4M: Side View of the vertical Si nanowire structure after the first gate is extended in the region close to the top NiSi contact on the high-k/TiN samples;

DETAILED DESCRIPTION OF THE INVENTION

Three non-limiting examples of processes, which can be used with the present invention, are presented below.

1ST EXAMPLE

Figure 1A:
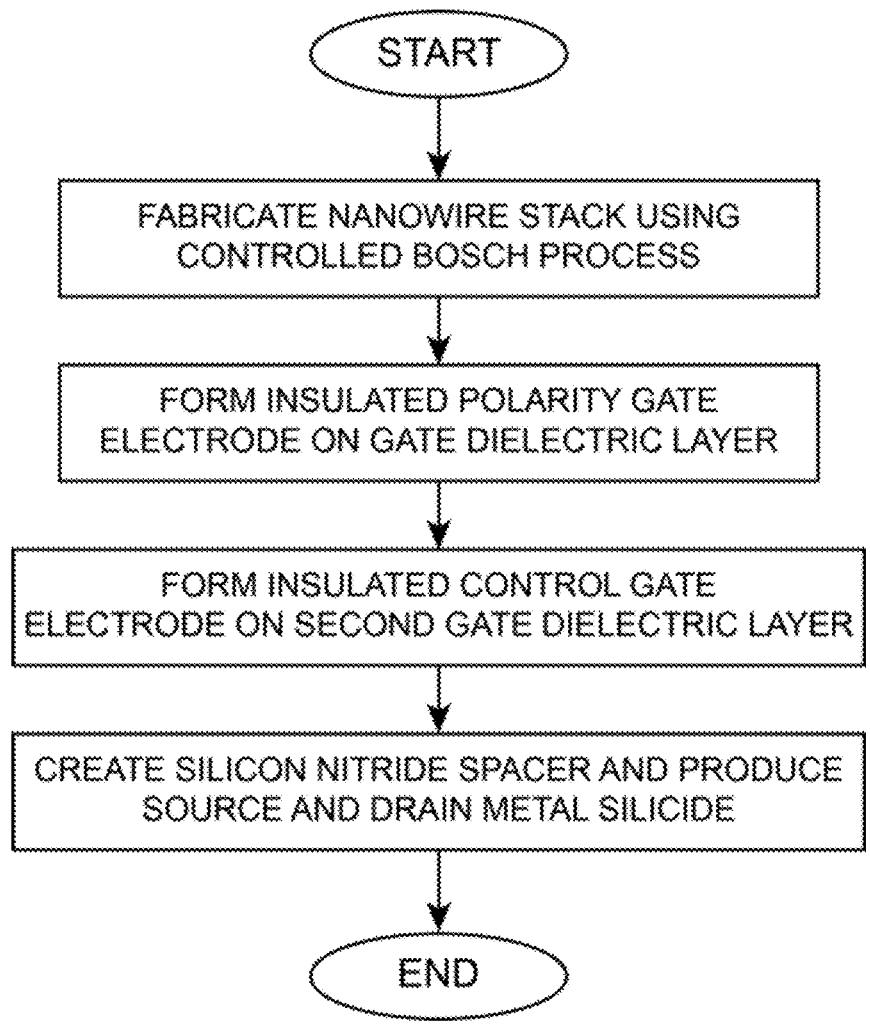
FIG. 1A: Process flow sequence for the fabrication of a Double Independent Gate structure.
Figure 1B:
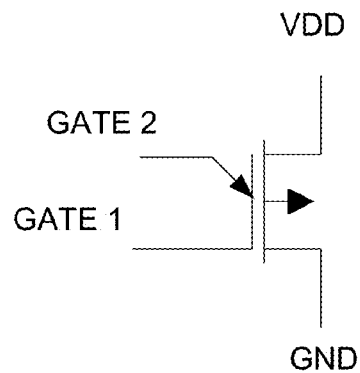
FIG. 1B: Schematic symbol of a double independent gate polarity-controlled transistor.
Figure 1C:
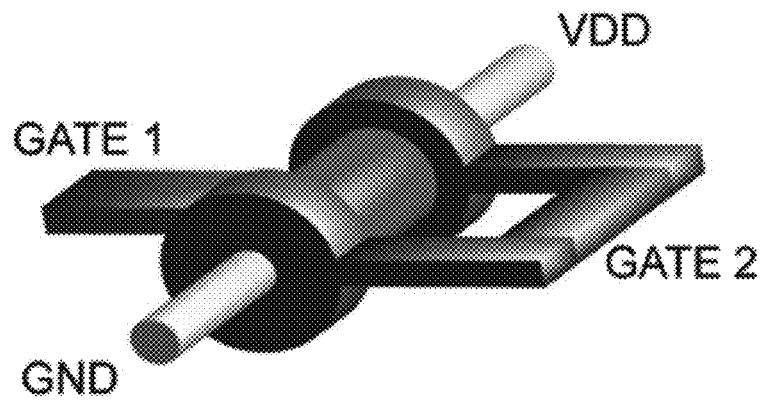
FIG. 1C: A double independent gate structure with 1 SiNW channel.
Figure 1D:
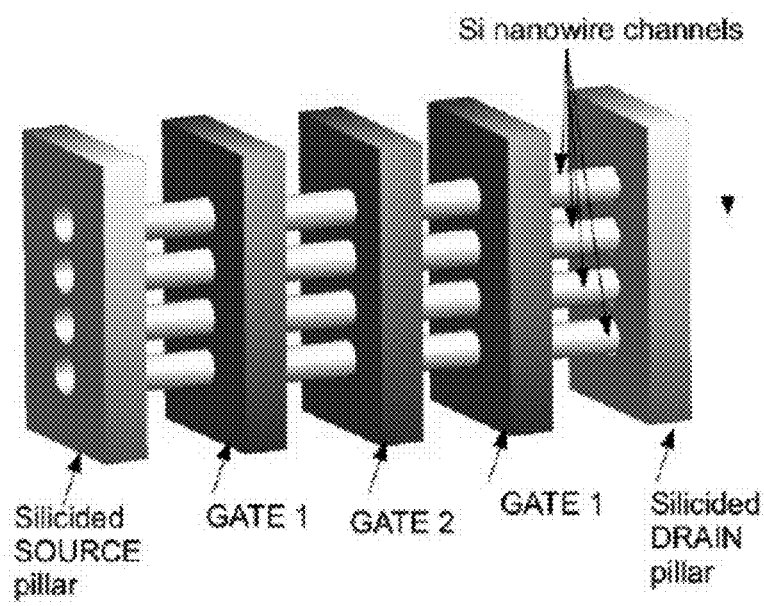
FIG. 1D: A double independent gate structure with 4 vertically stacked SiNW channels.
Figure 2A:
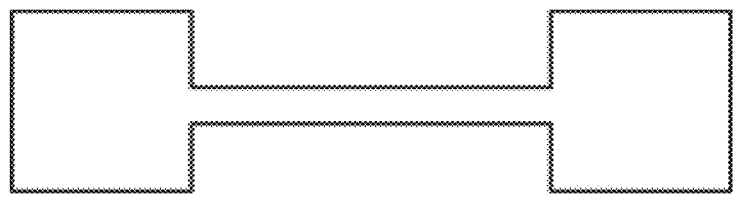
FIG. 2A: Top View of the SiNW channels anchored between two Si pillars.
Figure 2B:
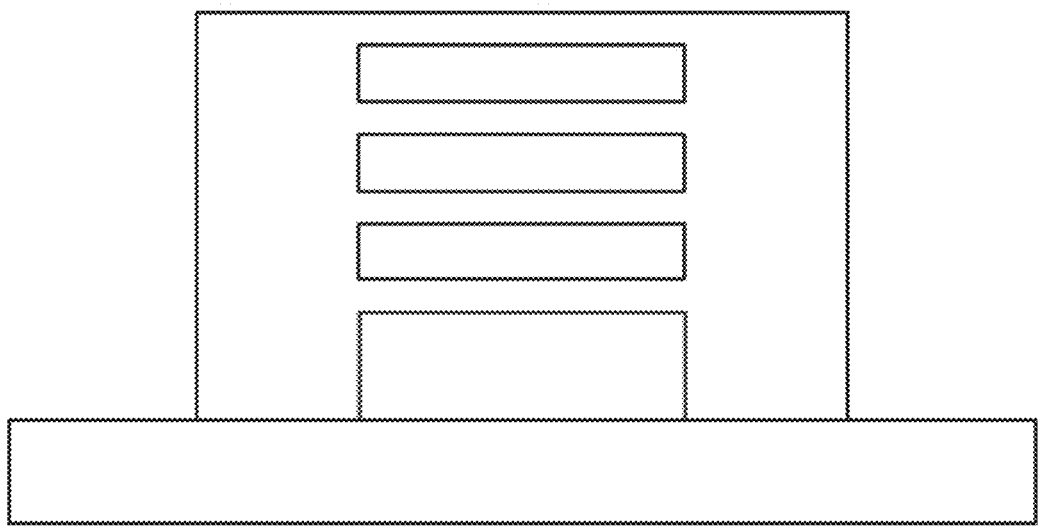
FIG. 2B: Side View of the SiNW channels anchored between two Si pillars.

In a $1^{st}$ example, the main steps of the device fabrication procedure are listed in FIG. 1A. Generally, the process includes creating a device channel, that is, a transistor channel 1 (FIG. 2J below), which can be composed of a vertical stack of a variable number of horizontal semiconducting nanowires, a parallel array of vertical stacks of horizontal nanowires, a fin-like structure (from which a FinFET transistor would be obtained) or a graphene ribbon. We will use the nanowire stack further on in this description as an example. FIG. 2B shows a cross section of the nanowire stack, with two pillar-like structures sustaining the nanowires, while FIG. 2A shows the top view of such stack.

After the channel structure is fabricated, a first gate insulator covering the channel section of the transistor is created. This gate insulator can be produced by direct oxidation of the transistor channel, or by deposition of various high-k dielectric materials.

Figure 2C:
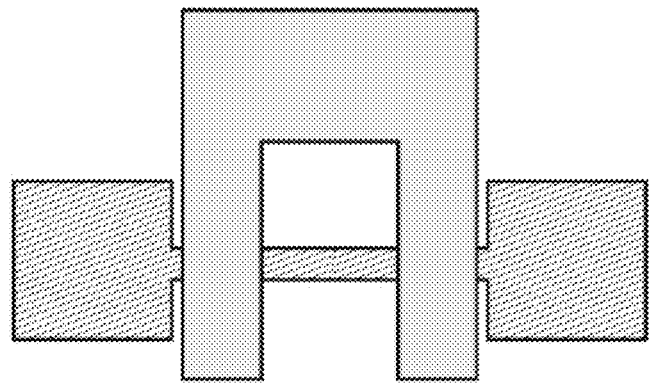
FIG. 2C: Top View of the first gate overlapping the regions in close proximity of the Si pillars. Later in the process the regions surrounded by this gate will be those mostly affected by the presence of a Schottky barrier (typically but not exclusively at the anchor point between SiNW and Si pillars)
Figure 2D:
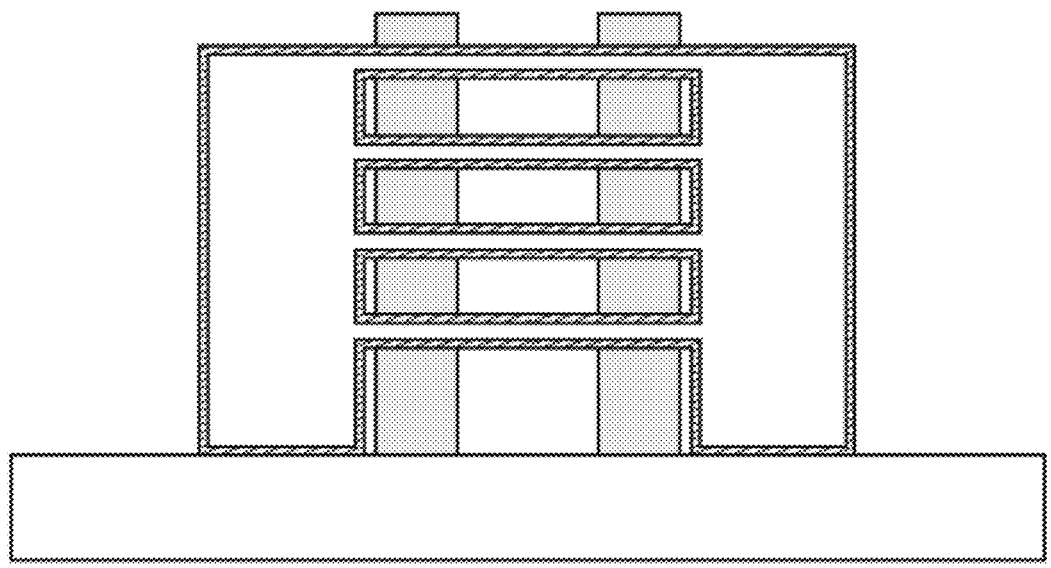
FIG. 2D: Side View of the first gate overlapping the regions in close proximity of the Si pillars. Later in the process the regions surrounded by this gate will be those mostly affected by the presence of a Schottky barrier (typically but not exclusively at the anchor point between SiNW and Si pillars)

A 1st gate electrode is deposited over the 1st gate insulator, and patterned to obtain a gate structure covering the side regions of the transistor channel (FIGS. 2C and 2D). This 1st gate structure will approach or partly overlap the regions where source/drain contacts will be formed.

Figure 2E:
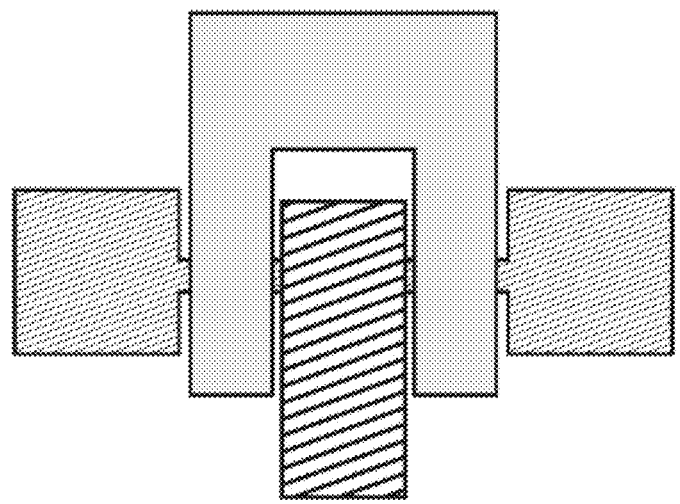
FIG. 2E: Top View of the structure after the second gate is patterned. The second gate is placed in the central region of the SiNW channels.
Figure 2F:
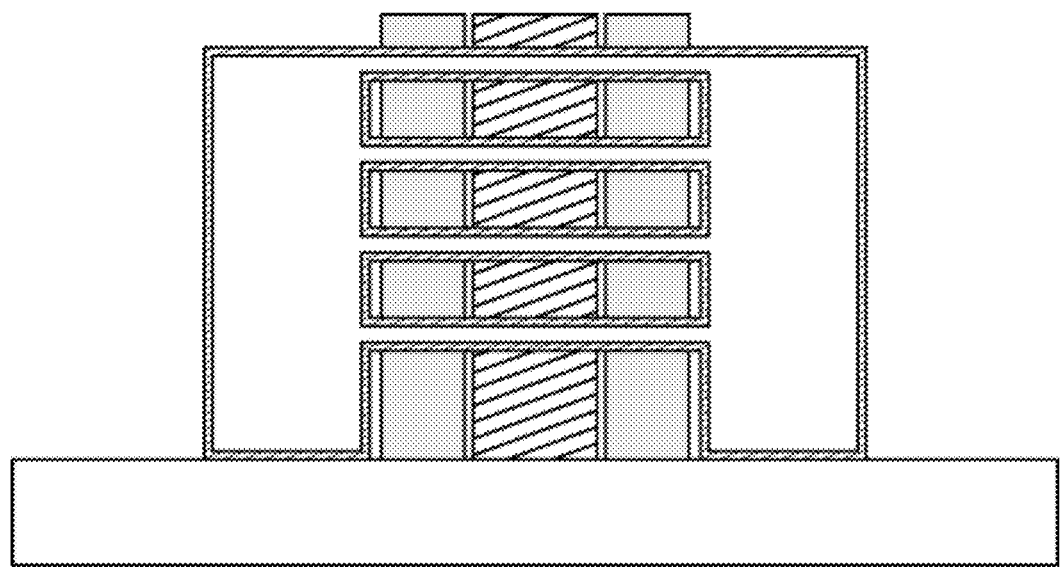
FIG. 2F: Side View of the structure after the second gate is patterned. The second gate is placed in the central region of the SiNW channels.

After the first gate electrode is fabricated, a second gate insulator is created in order to isolate the center region of the device, and a second gate electrode is deposited and patterned to act on the central region of the device. This second gate can be created by self-alignment to the 1$^{st}$ gate electrode (FIGS. 2E and 2F).

Figure 2G:
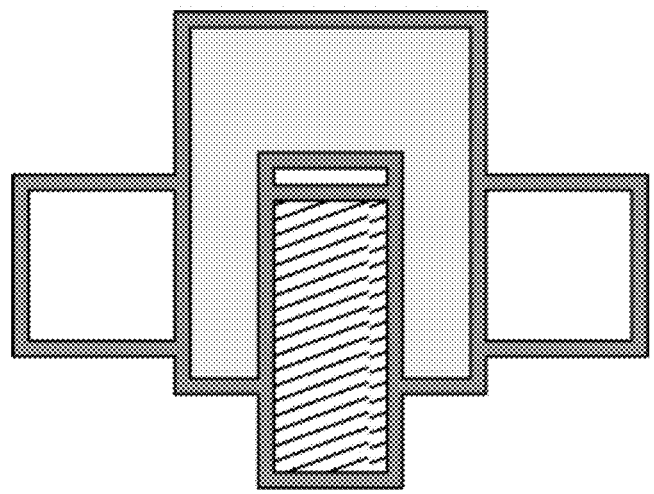
FIG. 2G: Top View of the structure after the sidewall spacer is defined. The sidewall spacer covers all the steps of the structure, thus providing isolation between the different parts.
Figure 2H:
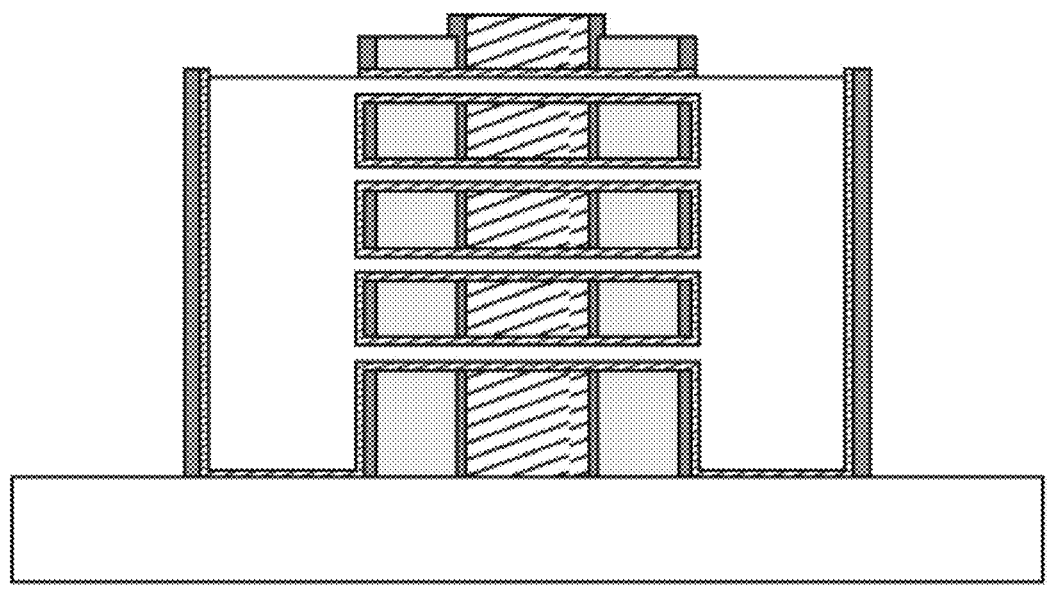
FIG. 2H: Side View of the structure after the sidewall spacer is defined. The sidewall spacer covers all the steps of the structure, thus providing isolation between the different parts.

After the second gate is formed, a spacer is formed by deposition and etching of a dielectric material such as Silicon Nitride (FIGS. 2G and 2H), in order to isolate gate electrodes and source/drain regions further on, when contacts will be formed.

Figure 2I:
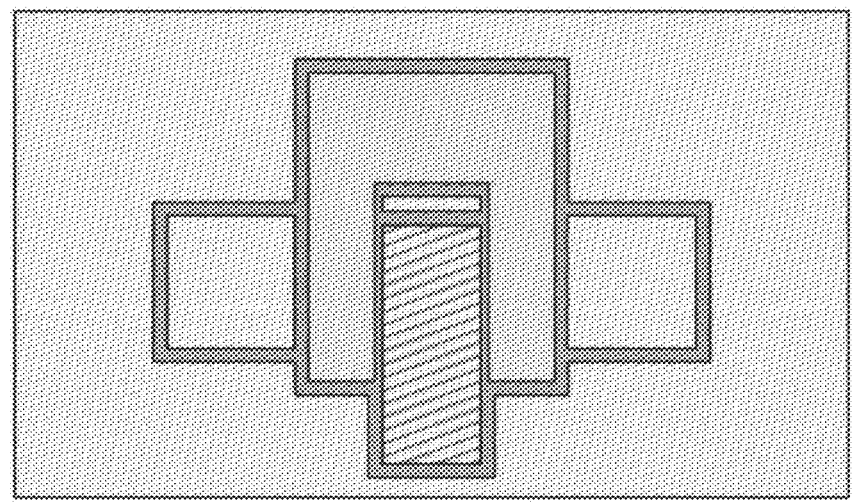
FIG. 2I: Top View of the structure after the deposition of a suitable metal for the silicide process.
Figure 2J:
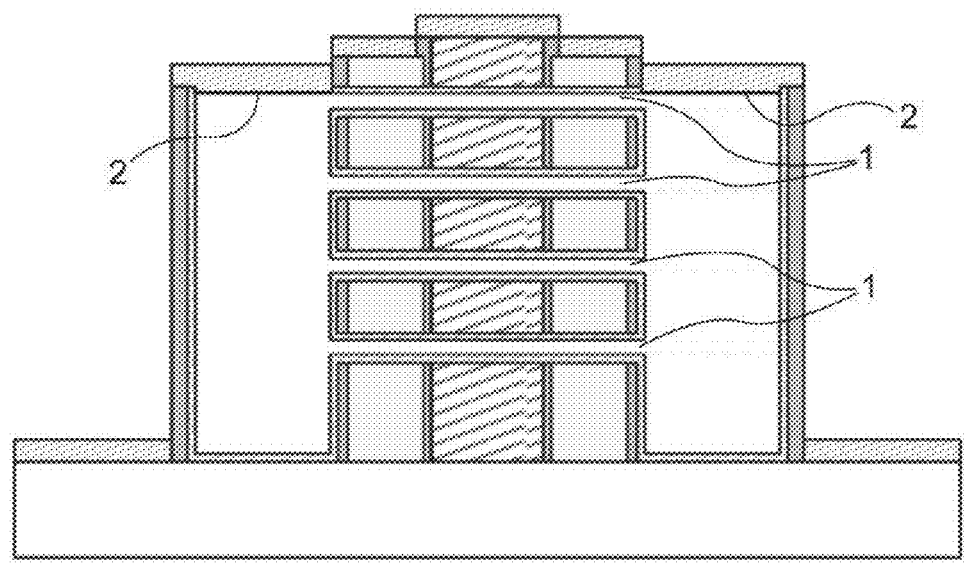
FIG. 2J: Side View of the structure after the deposition of a suitable metal for the silicide process.
Figure 2K:
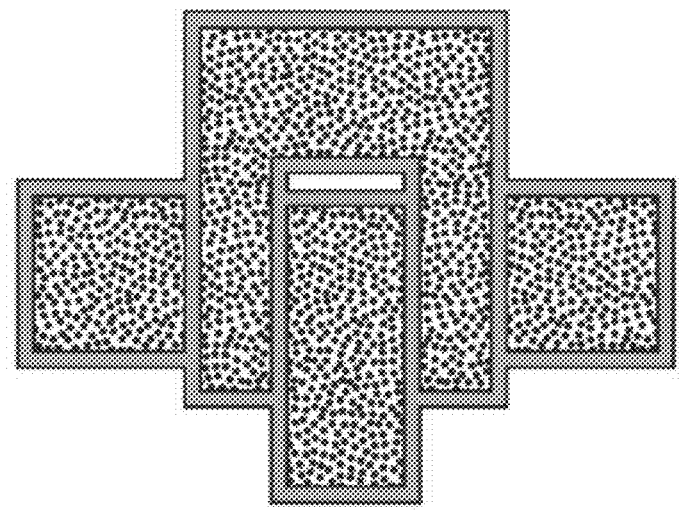
FIG. 2K: Top View of the structure after silicide formation.
Figure 2L:
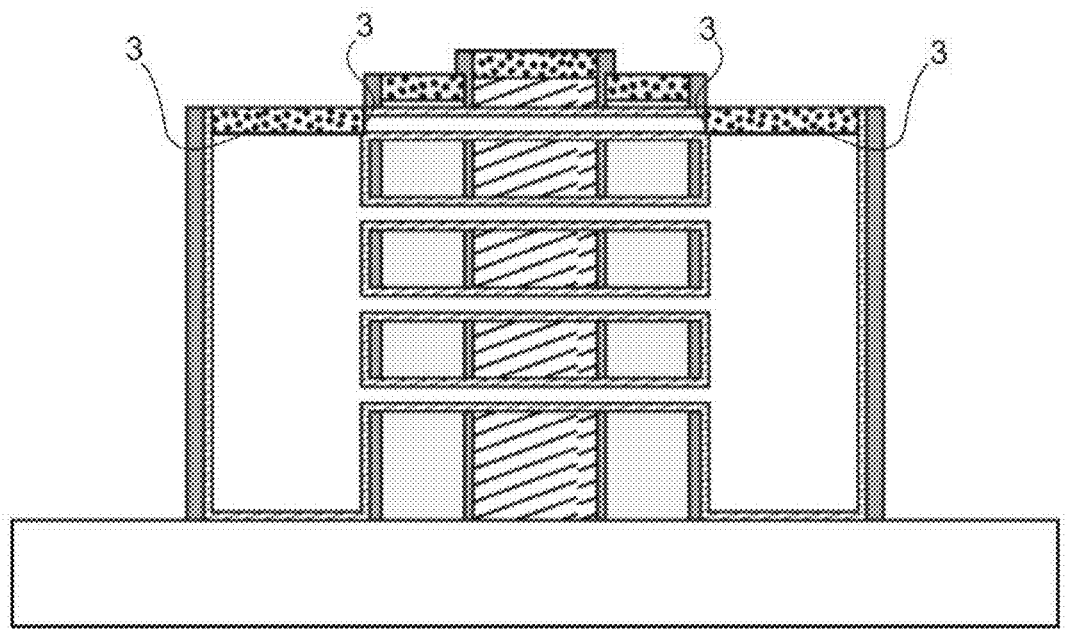
FIG. 2L: Side View of the structure after silicide formation.

Finally, an interface region 2 of the device is covered with a metal exhibiting near mid-gap work-function with respect to the channel semiconductor material (FIGS. 2I and 2J. By annealing, a silicide can be formed to create desired a Schottky barrier interface 3 at the two sides of the device channel, that is, the transistor channel 1, so that source/drain Schottky barriers approach or are covered by the first gate electrode (FIGS. 2K and 2L).

2ND EXAMPLE

Figure 3A:
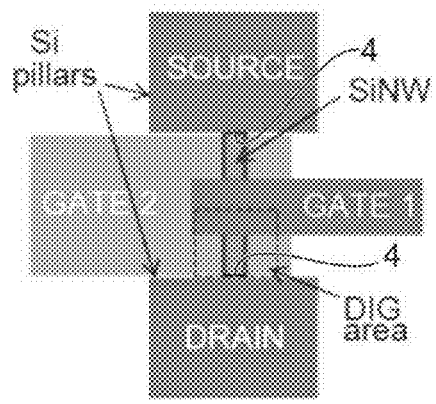
FIGS. 3A-3F: A $2^{nd}$ example of fabrication flow for double independent gate with Si nanowire structure in particular.
Figure 3B:
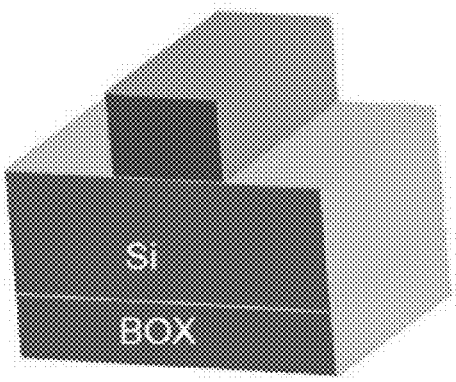
Figure 3C:
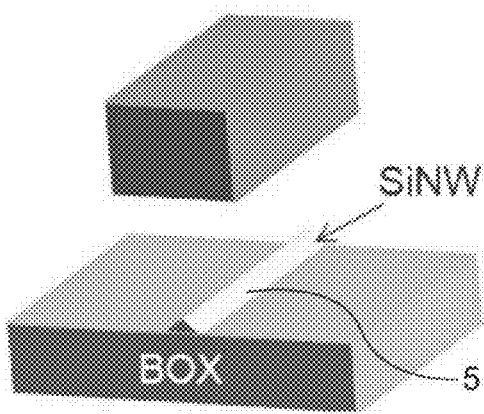
Figure 3D:
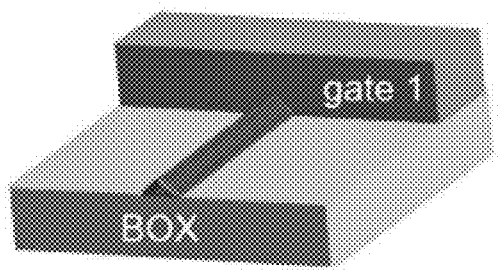
Figure 3E:
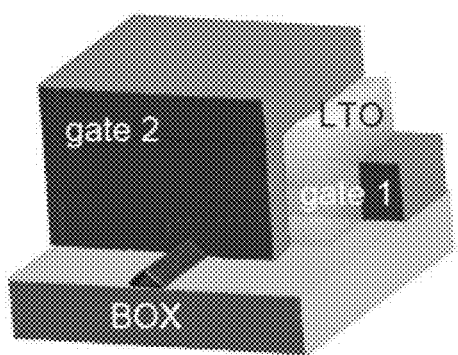
Figure 3F:
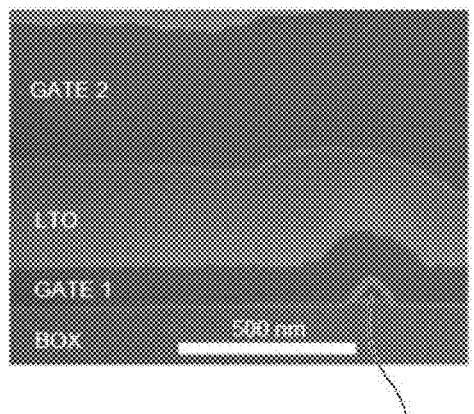

In a 2$^{nd}$ example, a single Si nanowire with Double Independent Gates, that is, Schottky barrier interfaces 4, is fabricated (see Top View of FIG. 3A). A low doping p-type ($N_A$~$10^{15}$ atoms/cm$^2$) SOI wafer with 1.5 μm device layer is spin coated. The photoresist is then patterned in 1.5 um wide lines (see FIG. 3B) and used as mask for a next isotropic Si etching. A Si plasma etching recipe is tuned to form a triangular 75 nm wide Si nanowire lying on top of the buried oxide (BOX) layer (FIG. 3C). The Si nanowire is a transistor channel 5 in this embodiment. Then a 30 nm thick gate oxidation and a 150 nm polysilicon layer are deposited with a low-pressure chemical vapor deposition (LPCVD) method to form a main gate with 7.5 μm length (gate 1, FIG. 3D). 300 nm LPCVD low temperature oxide (LTO) is used to isolate the main gate. A second 500 nm polysilicon layer is then deposited. Then a thick photoresist is spun over the wafer and planarized using a chemical mechanical polishing procedure. This method leaves a protective polymer layer that is used to etch a second polysilicon gate self-aligned within the cavity thanks to the topography (see gate 2 in FIG. 3E). After standard cleaning steps, one additional patterning of gate 2 is performed to remove the unnecessary polysilicon and to form areas for the contacts (see the top view of the device in FIG. 3A). In FIG. 3F a focused ion beam cross-section of the triangular SiNW channel, that is, a depleted region 6, with the double independent gate stack is shown. Then source/drain contacts are formed by means of NiSi silicidation in a horizontal wall furnace in forming gas at 400° C. Finally Al metal lines and pad area are defined for the electrical characterization.

3RD EXAMPLE

Figure 4A:
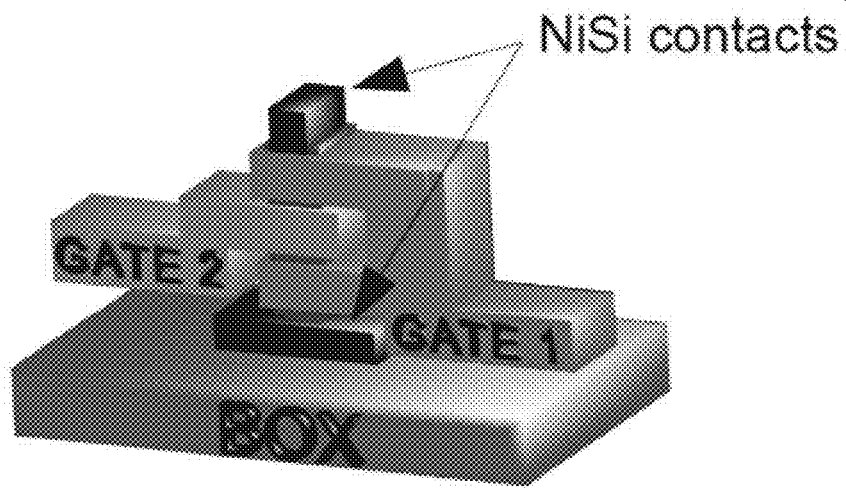
FIGS. 4A-4M: A $3^{rd}$ example of fabrication flow for double independent gate structure with SiNW channel in particular.
Figure 4B:
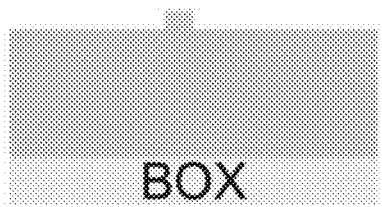
Figure 4C:
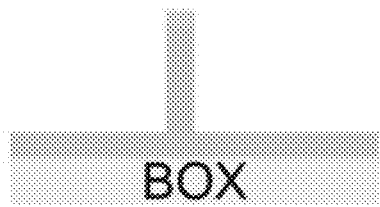
Figure 4D:
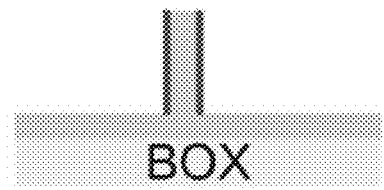
Figure 4E:
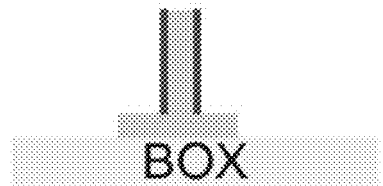
Figure 4F:
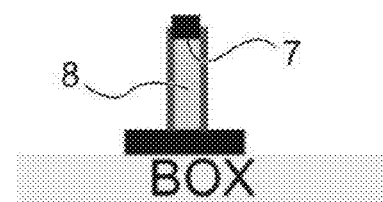
Figure 4G:
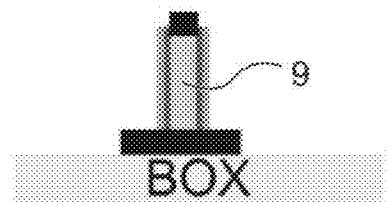

In a 3$^{rd}$ example, vertical Si nanowires with Double Independent Gate All-Around are fabricated (see FIG. 4A). The Si nanowires are vertically etched in parallel on 10 SOI wafers after having patterned a SiO2 hard mask by lithography (FIG. 4B and FIG. 4C). The Si nanowire are then freestanding and anchored at the bottom where a Si layer is still left for subsequent processing (FIG. 4C). Then a SiO$_2$ or a Si$_3$N$_4$ layer is deposited all-around by LPCVD method on 9 and 1 SOI wafer, respectively. Then SiO$_2$/Si$_3$N$_4$ spacers are formed by vertical plasma etching in a dry etching tool (FIG. 4D). At this stage, the Si nanowires are surrounded by a SiO$_2$ or a Si$_3$N$_4$ dielectric, while the planar layer on top of the Buried Oxide and the top section of the Si nanowires reveal a non-passivated Si surface or with a native Si oxide thinner than 10 angstroms. Then another lithography defines the bottom layer that is etched in order to isolate the Si nanowires (FIG. 4E). Subsequently, a Ni metal layer is deposited by electron beam evaporation and annealed at 450° C. in a Rapid Thermal Annealing furnace with constant N2 flow for 20 seconds. The annealing process is carried out in order to form a thin NiSi layer at the top and at the bottom of the Si nanowires; thus Ni alloys with Si due to the contact with Si. For the Si regions masked by the thick SiO$_2$ or Si$_3$N$_4$ spacer, the Ni metal cannot react with Si. The sample is then dipped into a hot Piranha solution in order to strip the unreacted Ni layer, leaving only the NiSi Schottky barrier interface 7 and the Si nanowire, that is, the depleted region 8, structure surrounded by the dielectric mask, thanks to the etching selectivity between Ni and NiSi, Si, SiO$_2$ or Si$_3$N$_4$ in hot Piranha solution (see FIG. 4F). For 8 SOI wafers the SiO2 surrounding the Si nanowire is stripped by vapor HF method and replaced by one of the following high-k dielectrics, one per each SOI wafer:
 1. HfO$_2$;
 2. TiO$_2$;
 3. Al$_2$O$_3$;
 4. ZrO$_2$;
 5. HfSiO;
 6. HfSiON;
 7. Ta$_2$O$_5$;
 8. Lead-zirconate-titanate (PZT);

All the high-k dielectrics are deposited by atomic layer deposition (ALD) system. Subsequently to the high-k dielectric deposition, a 10 nm thin TiN is deposited in the same ALD equipment without breaking the vacuum. Then the high-k samples are processed in a conventional dry etcher tool in order to remove the high-k material and the TiN on top of the NiSi regions (FIG. 4G). A transistor channel 9 is formed.

Figure 4H:
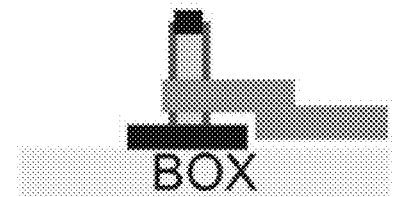
Figure 4I:
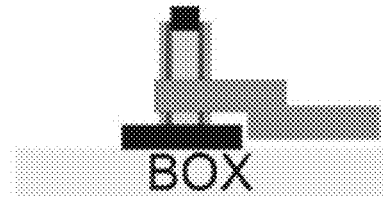
Figure 4J:
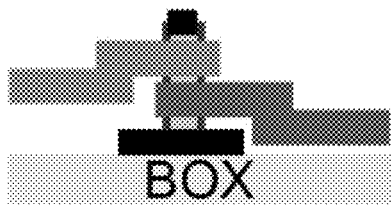
Figure 4K:
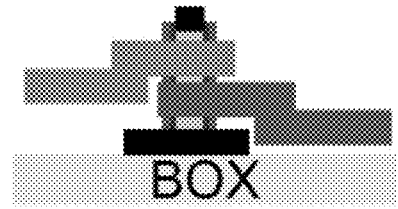
Figure 4L:
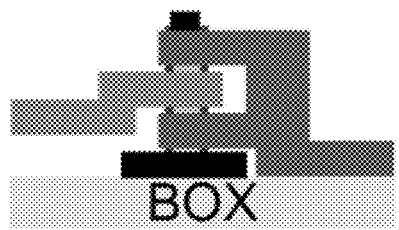
Figure 4M:
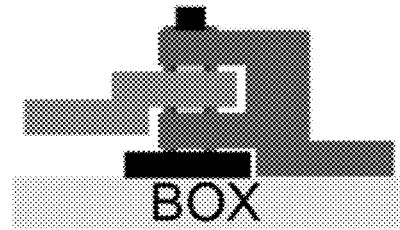
Figure 5A:
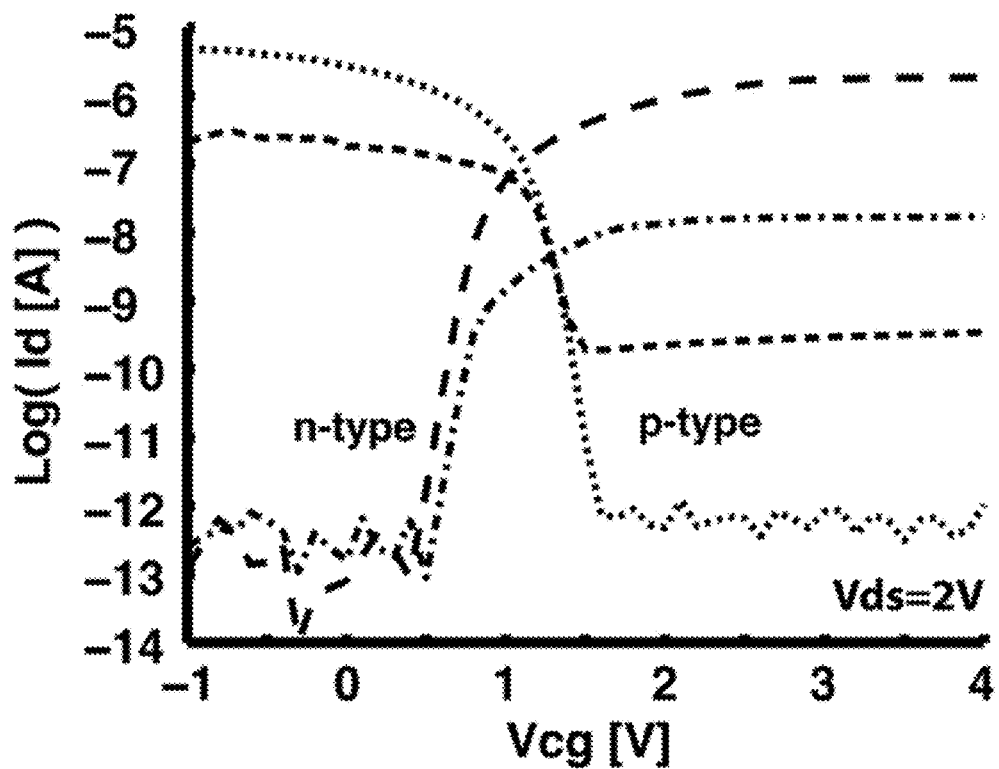
FIG. 5A: n- and p-type conduction is selected by different Vpg (second gate voltage) biases. Currents in the p-type and n-type branch are comparable. Both n and p-type device branches show subthreshold slopes of about 70 mV/dec. Ion/Ioff ratios of about $10^7$ ($10^6$) are obtained respectively for the n-type (p-type) conduction branches. This curve demonstrate the feasibility of the polarity control, full explaination can be found in reference [13]
Figure 5B:
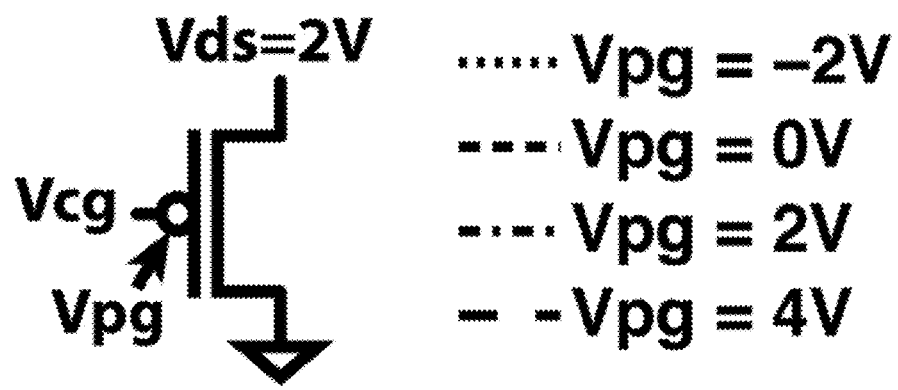
FIG. 5B: The device connections and voltage biases are referring to the measurements of FIG. 5A.

Then all the 10 SOI wafers are covered by a 50 nm thick amorphous Si layer deposited by LPCVD followed by a spin coating of a 50 nm thick HSQ layer. After the HSQ exposure in an e-beam lithography system, excessive amorphous Si is etched isotropically in a dry etcher with a SF$_6$/C$_4$F$_8$ plasma with low bias to minimize ion bombardment and maximize the chemical reaction between SF, ions with the amorphous Si. At this stage a first amorphous Si gate surrounds the Si nanowire portion close to the bottom NiSi contact (see FIG. 4H for SiO$_2$ or Si$_3$N$_4$ dielectrics and FIG. 4I for high-k dielectrics). Then the amorphous Si deposition step and HSQ lithography are repeated in order to define a second independent gate (see FIG. 4J for SiO$_2$/Si$_3$N$_4$ and FIG. 4K for the high-k/TiN stack). Then another layer of amorphous Si is deposited after capping the second independent gate with a dielectric. In this way the first gate is extended to the region in proximity of the top NiSi to SiNW contact (see FIG. 4L for SiO$_2$/Si$_3$N$_4$ and FIG. 4M for the high-k/TiN stack).

The TiN in the high-k samples is then removed by dipping into a RCA1 chemical solution at 60° C. for 60 s, thus isolating the two gates and the NiSi contacts.

Then, the Si nanowire structures are passivated in a Low Temperature Oxide matrix deposited by LPCVD and VIA holes are etched on top of the NiSi contacts and the gate vias. Finally, Chemical Mechanical Polishing and lift-off are used respectively to define W plugs and Al wires.

REFERENCES

1. Jia CHEN and Edward J. NOWAK. "*Complementary carbon nanotube triple gate technology*", May 2007.
2. Dimitris E. IOANNOU, Souvick MITRA, and Akram SALMAN. "*Double gate (dg) soi ratioed logic with intrinsically on symmetric dg-mosfet load*", February 2007.

3. Yu-Ming Lin, J. Appenzeller, J. Knoch, and P. Avouris. "*High-performance carbon nanotube field-effect transistor with tunable polarities. Nanotechnology*", IEEE Transactions on, 4(5):481-489, September 2005.
4. M. H. Ben-Jamaa, K. Mohanram, and G. D. Micheli, "*Novel Library of Logic Gates with Ambipolar CNTFETs: Opportunities for Multi-Level Logic Synthesis,*" in 2009 Design, Automation and Test in Europe, 2009, pp. 622-627.
5. Y.-M. Lin, J. Appenzeller, and P. Avouris, "*Ambipolar-to-unipolar conversion of carbon nanotube transistors by gate structure engineering,*" Nano Letters, vol. 4, no. 5, pp. 947-950, 2004.
6. M. Ben-Jamaa, K. Mohanram, and G. De Micheli, "*An efficient gate library for ambipolar cntfet logic,*" Computer-Aided Design of Integrated Circuits and Systems, IEEE Transactions on, vol. 30, no. 2, pp. 242-255, February 2011.
7. K. Mohanram and J. Guo, "*Graphene nanoribbon fets: technology exploration and cad,*" in Proceedings of the 2008 IEEE/ACM International Conference on Computer-Aided Design, ser. ICCAD '08, 2008, pp. 412-415.
8. S.-M. Koo, Q. Li, M. D. Edelstein, C. A. Richter, and E. M. Vogel, "*Enhanced Channel Modulation in Dual-Gated Silicon Nanowire Transistors,*" Nano Letters, vol. 5, no. 12, pp. 2519-2523, 2005.
9. D. Sacclietto, G. De Micheli and and Y. Leblebici. "*Ambipolar Gate-Controllable SiNW FETs for Configurable Logic Circuits With improved Expressive Capability*", IEEE Electron Device Letters, vol. 33, num. 2, p. 143-145, 2012.
10. M. De Marchi, S. Bobba, H. Ben Jamaa and G. De Micheli. "*Synthesis of regular computational fabrics with ambipolar CNTFET technology*". 17th IEEE International Conference on Electronics, Circuits, and Systems (ICECS 2010), Athens, Greece, 2010.
11. M. Dc Marchi, H. Ben Jamaa and G. De Micheli. "*Regular Fabric Design with Ambipolar CNTFETs for FPGA and Structured ASIC Applications*". IEEE/ACM International Symposium on Nanoscale Architectures (Nanoarch '10), Anaheim, Calif., USA, 2010.
12. D. Sacchetto, M. H. Ben-Jamaa, G. De Micheli, and Y. Leblebici. "*Fabrication and charac-terization of vertically stacked gate-all-around si nanowire fet arrays,*" Solid State Device Research Conference, 2009. ESSDERC '09. Proceedings of the European, pages 245-248, September 2009.
13. M. De Marchi, D. Sacchetto, S. Frache, J. Zhang, and P.-E, J. M. Gailardon et al. *Poparity control in Double-Gate, Gate-All-Around Vertically Stacked Silicon Nanowire FETs*. Internation Electron Devices Metting (IEDM), San Francisco, Calif., USA, Dec. 10-12, 2012.

The invention claimed is:

1. A method for manufacturing a silicon nanowire (SiNW) field effect transistor device with a double independent gate structure, the silicon nanowire field effect transistor comprising:
  a first gate used to build up an electric field potential to modulate regions of a SiNW channel affected by a presence of a Schottky barrier interface, comprising:
    an interface region between the metal-to-semiconductor contact; and
    a depleted region in the semiconductor whose depletion is consequence of the presence of the Schottky barrier interface;
  the silicon nanowire field effect transistor further comprising:
  a second gate structure utilized to produce an electric field potential, which modulates further regions of a semiconducting channel not affected by the presence of the Schottky barrier interface, namely a portion of the channel
  the method comprising;
  forming the SiNW channel as a vertical semiconducting fin-like structure, self sustaining or sustained by pillar like structures, one of the pillar like structures embodying a drain contact, another of the pillar like structures embodying a source contact;
  forming an insulating layer on which the first gate electrode is formed, covering side and top surfaces of the fin-like structure in proximity of the source and drain contacts; forming a second insulating layer on which the second gate electrode is formed, covering a center region of the fin-like structure at the side and top surfaces;
  forming a metallic layer on the pillars embodying the drain and source contact respectively and creating a silicide in proximity of the side regions of the fin-like structure; and
  forming a metallic region close to the source and drain in which the pillars may also be hollowed down to a given depth by dry or wet etching and the silicide formed so as to reach the bottom of the fin and reduce contact resistance.

2. The method of claim 1, wherein the vertical semiconducting fin-like structure comprises horizontal semiconducting nanowires in a vertical stack composed of a number of horizontal nanowires ranging from 1 to about 1000, held between the pillars embodying the drain and source contacts respectively.

3. The method of claim 1, wherein the fin-like structures are isolated from the transistor substrate by a dielectric, such as a buried oxide (BOX) layer.

4. The method of claim 1, wherein the fin-like structures are electrically connected to the substrate.

5. A method for manufacturing a graphene nanowire field effect transistor device with a double independent gate structure, the graphene nanowire field effect transistor comprising:
  a first gate used to build up an electric field potential to modulate regions of a graphene channel affected by a presence of a Schottky barrier interface, comprising:
    an interface region between the metal-to-semiconductor contact; and
    a depleted region in the semiconductor whose depletion is consequence of the presence of the Schottky barrier interface;
  the graphene nanowire field effect transistor further comprising:
  a second gate structure utilized to produce an electric field potential, which modulates further regions of a semiconducting channel not affected by the presence of the Schottky barrier interface, namely a portion of the channel;
  the method comprising:
  forming a horizontal or vertical graphene nanoribbon connected between two metallic source and drain contacts, the graphene nanoribbon comprising the graphene nanowire;
  forming an insulating layer on which the first gate electrode is formed, covering one or both surfaces of the graphene nanoribbon in proximity of the source and drain contacts; and
  forming a second insulating layer on which the second gate electrode is formed, covering the center region of the graphene nanoribbon at one or both surfaces.

6. The method of claim 1 wherein the SiNW channel is formed from at least one of: Si, SiGe, Ge, using a top-down fabrication method such as using a controlled Bosch process dry etching or an anisotropic vertical etch plus a selective Si/SiGe etch.

7. The method of claim 1,
wherein dielectric layers of the first gate and of the second gate are each formed from at least one of: $SiO_2$, $HfO_2$, $Al_2O_3$, $TiO_2$, TiON, TiSiON, HfSiO, HfSiON, AlSiO, AlSiON.

8. The method of claim 7 with any stoichiometry of the claimed dielectric layers.

9. The method of claim 1,
wherein the metallic layer is comprised from at least one transition metal (e.g. Ni, Ti, Co, Mn, Pt, Pd, . . . ).

10. The method of claim 1,
wherein the silicide is formed from at least one transition metal (e.g. NiSi, NiSi2, TiSi2, CoSi, PdSi2, PtSi, . . . ).

11. The method of claim 1, wherein the method implements top down fabrication of sea-of-gates topology with ambipolar devices relying on double independent gate architecture for customization of their functionality.

12. The method of claim 5, wherein the method implements top down fabrication of sea-of-gates topology with ambipolar devices relying on double independent gate architecture for customization of their functionality.

* * * * *